United States Patent [19]
Gardner et al.

[11] Patent Number: 5,882,993
[45] Date of Patent: *Mar. 16, 1999

[54] INTEGRATED CIRCUIT WITH DIFFERING GATE OXIDE THICKNESS AND PROCESS FOR MAKING SAME

[75] Inventors: Mark I. Gardner, Cedar Creek; Fred N. Hause, Austin, both of Tex.

[73] Assignee: Advanced Micro Devices, Inc., Sunnyvale, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 699,249

[22] Filed: Aug. 19, 1996

[51] Int. Cl.$^6$ .............................. H01L 21/44; H01L 21/31
[52] U.S. Cl. ............................................ 438/591; 438/769
[58] Field of Search .............................. 437/241, 57, 240, 437/235; 438/591, 769, 770, 775

[56] References Cited

U.S. PATENT DOCUMENTS

| | | |
|---|---|---|
| 4,098,618 | 7/1978 | Crowder et al. . |
| 4,551,910 | 11/1985 | Patterson . |
| 4,682,407 | 7/1987 | Wilson et al. . |
| 4,707,721 | 11/1987 | Ang et al. . |
| 4,729,009 | 3/1988 | Ang . |

(List continued on next page.)

FOREIGN PATENT DOCUMENTS

| | | |
|---|---|---|
| 0216246 | 4/1987 | European Pat. Off. . |
| 0532260 | 2/1993 | European Pat. Off. . |
| 30 32 608 | 3/1981 | Germany . |
| 5-283678 | 10/1993 | Japan . |
| 7-297298 | 11/1995 | Japan . |

OTHER PUBLICATIONS

Kuroi et al, "Novel Structure For HIgh Reliability and High Performance 0.25 micron Dual Gate CMOS", IEDM, pp. 325–328, 1993, No Month.

S. Wolf, "Silicon Processing for the VLSI Era" Lattice Press 1986, p. 321, and no month.

(List continued on next page.)

*Primary Examiner*—John F. Niebling
*Assistant Examiner*—Michael S. Lebentritt
*Attorney, Agent, or Firm*—Conley, Rose & Tayon; Kevin L. Daffer; Robert C. Kowert

[57] ABSTRACT

A semiconductor process for producing two gate oxide thicknesses within an integrated circuit in which a semiconductor substrate having a first region and a second region is provided. The first region and the second region are laterally displaced with respect to one another. A nitrogen species impurity distribution is then introduced into the first region of the semiconductor substrate. Thereafter, a gate dielectric layer is grown on an upper surface of the semiconductor substrate. The gate dielectric has a first thickness over the first region of the semiconductor substrate and a second thickness over the second region of the semiconductor substrate. The first thickness is less than the second thickness. In a CMOS embodiment of the present invention, the first region of the semiconductor substrate comprises p-type silicon while the second substrate region comprises n-type silicon. Preferably, the step of introducing the nitrogen species impurity distribution into the semiconductor substrate is accomplished by thermally oxidizing the first substrate region in a nitrogen bearing ambient. In a presently preferred embodiment, the nitrogen bearing ambient includes $N_2O$, $NH_3$, $O_2$ and HCl in an approximate ratio of 60:30:7:3. In alternative embodiments the nitrogen bearing ambient includes NO, $O_2$ and HCl in an approximate ratio of 90:7:3 or $N_2O$, $O_2$ and HCl in an approximate ratio of 90:7:3. The introduction of the nitrogen species impurity into first substrate region 102 may alternatively be accomplished with rapid thermal anneal processing.

19 Claims, 2 Drawing Sheets

U.S. PATENT DOCUMENTS

| | | |
|---|---|---|
| 4,774,197 | 9/1988 | Haddad et al. . |
| 4,776,925 | 10/1988 | Fossum et al. . |
| 4,808,261 | 2/1989 | Ghidini et al. . |
| 4,851,257 | 7/1989 | Young et al. . |
| 4,866,002 | 9/1989 | Shizukuishi et al. . |
| 4,922,319 | 5/1990 | Fukushima . |
| 5,043,780 | 8/1991 | Fazan et al. . |
| 5,082,797 | 1/1992 | Chan et al. . |
| 5,102,832 | 4/1992 | Tuttle . |
| 5,138,411 | 8/1992 | Sandhu . |
| 5,172,200 | 12/1992 | Muragishi et al. . |
| 5,191,509 | 3/1993 | Wen . |
| 5,208,176 | 5/1993 | Ahmad et al. . |
| 5,250,456 | 10/1993 | Bryant . |
| 5,254,489 | 10/1993 | Nakata . |
| 5,268,992 | 12/1993 | Ahrens et al. . |
| 5,286,992 | 2/1994 | Ahrens et al. . |
| 5,308,787 | 5/1994 | Hong et al. . |
| 5,330,920 | 7/1994 | Soleimani ................................ 437/24 |
| 5,330,935 | 7/1994 | Dobuzinsky . |
| 5,340,764 | 8/1994 | Larsen et al. . |
| 5,358,894 | 10/1994 | Fazan et al. . |
| 5,432,114 | 7/1995 | O ............................................. 437/56 |
| 5,480,828 | 1/1996 | Hsu et al. . |
| 5,502,009 | 3/1996 | Lin . |
| 5,576,226 | 11/1996 | Hwang . |
| 5,576,266 | 11/1996 | Flosenzier et al. . |
| 5,576,570 | 11/1996 | Ohsawa et al. . |

OTHER PUBLICATIONS

B. Doyle, et al., "Simultaneous Growth of Different Thickness Gate Oxides in Silicon CMOS Processing," IEEE Electron Device Letters, vol. 16, No. 7, Jul. 1995.

A. Philipossian, et al. "Kinetics of Oxide Growth during Reoxidation of Lightly Nitrided Oxides," J. Electrochem. Soc. V. 139, No. 9, L82–3 Sep. 1992.

J. Ahn, et al., "High Quality Ultrathin Gate Dielectrics Formation by Thermal Oxidation of Si in N20," J. Electrochem. Soc. V. 139, No. 9. L39–41, Sep. 1991.

IBM Technical Disclosure Bulletin, vol. 14, No. 11, "Improvement of the Gate–Region Integrity In Fet Devices," S.A. Abbas and P.G. Stern, Apr. 1972, pp. 3348–3350.

Journal of the Electrochemical Society, No. 2, Manchester, NH, "Effect of Bottom Oxide on the Integrity of Interpolysilicon Ultrathin ONO (Oxide/Nitride/Oxide) Films," Yasushi Naito, Yuichi Hirofuji, and Hiroshi Iwasaki, Feb. 1990, pp. 635–638.

Nuclear Instruments and Method in Physics, Elsevier Science Publishers B.V., North Holland, "Plasma Immersion Ion Implantation For ULSI Processing," Nathan W. Cheung, 1991, pp. 811–820, No Month.

Latice Press, Sunset Beach, California, "Silicon Processing for the VLSI Era, vol. 1, Process Technology," Stanley Wolf Ph.D., 1986, pp. 198–218, No Month.

Molle, P. et al., "Nitrogen Implantation for Local Oxidation of Silicon," Nuclear Instruments & Methods in Physics Research, Section—B: Beam Interactions with Materials and Atoms, vol. B55, No. 1 / 04, Apr. 2, 1991, pp. 860–865.

Schott, K. et al., "Blocking of Silicon Oxidation by Low-Dose Nitrogen Implantation," Applied Physics A. Solids and Surfaces, vol. A45, No. 1, Jan. 1, 1988, pp. 73–76.

Patent Abstracts of Japan, Publication No. 01183844; Publication Date: Jul. 21, 1989; Application Date: Jan. 19, 1988; Application No. 63008901.

International Search Report for PCT/US97/09638, dated Sep. 16, 1997.

INTEGRATED CIRCUIT WITH DIFFERING GATE OXIDE THICKNESS AND PROCESS FOR MAKING SAME

BACKGROUND OF THE INVENTION

1. Feild the Invention

The invention relates to the field of semiconductor processing and more particularly to an MOS integrated circuit in which select transistors are fabricated with a thinner gate oxide than the remaining transistors.

2. Description of the Relevant Art

Very large scale integrated (VLSI) metal-oxide-semiconductor ("MOS") circuits include a large number of interconnected transistors formed in a silicon substrate. Typically, the gate electrode of the MOS transistor functions as the transistor's input. The transistor is typically activated or turned on by driving the gate voltage ($V_G$) to a threshold value, the threshold voltage ($V_T$) The drain current ($I_D$) of an MOS transistor typically serves as the transistor's output. Because the gate electrode of each transistor has a small but finite capacitance associated with it, the gate electrode cannot instantaneously achieve a desired change in voltage. Instead, a finite amount of time is required to charge the small gate capacitor to the appropriate voltage level. The amount of time required for a gate electrode to achieve a threshold level can be reduced by decreasing the capacitance of the gate electrode or increasing the drain current of transistors from preceding stages. Generally, for small values of drain voltage, $V_D$, (i.e., $V_D < V_G - V_T$) the drain current $I_D$ of an MOS transistor increases linearly with the drain voltage (assuming $V_G \geq V_T$). As $V_D$ is increased beyond this linear region, however, $I_D$ levels off and becomes independent, to a first order approximation, of $V_D$. This value of $I_D$ is commonly referred to as the saturated drain current, $I_{Dsat}$. In other words, $I_{Dsat}$ is the maximum drain current produced by an MOS transistor operating under normal biasing (i.e., $V_D = V_{CC}$, $|V_G| \geq |V_T|$, and $V_{SS} = 0$ V) for a given gate voltage. $I_{Dsat}$ is, therefore, a direct measure of the potential speed of an MOS circuit. Increasing $I_{Dsat}$ increases the integrated circuit's performance by enabling each transistor to drive subsequent stages of transistors to their threshold voltage in less time.

In the linear region, $I_D = k (V_G - V_{DS}/2) V_{DS}$, where $k = \mu C_{ox} W/L$. Inspection of this equation reveals that $I_D$ can be increased by increasing the oxide capacitance $C_{ox}$. In addition to increasing k, a larger oxide capacitance reduces the threshold voltages $V_T$ for the general case in which the total charge $Q_{TOT}$ trapped within the oxide and trapped at the oxide-silicon interface is relatively small. The capacitance, $C_{ox}$, of an MOS transistor is closely approximated by a parallel plate capacitor such that $C_{ox} = A\epsilon/t_{ox}$ where A is the area of the gate structure, $\epsilon$ is the permitivity of the dielectric, and $t_{ox}$ is the oxide thickness. Because it is undesirable to increase the area of the gate and difficult to alter the dielectric, increasing the capacitance $C_{ox}$ must be accomplished by decreasing the oxide thickness $t_{ox}$.

In many complementary metal oxides semiconductor (CMOS) processes, the gate structures for the transistors are formed from heavily doped polysilicon. To achieve a degree of symmetry between the p-channel and n-channel transistors, it is not uncommon to dope the gate structures of the n-channel devices with an n-type impurity such as arsenic or phosphorous while doping the gate structures of the p-channel devices with a p-type impurity such as boron. The doping of the p-channel polysilicon gate with boron can become problematic for thin gate oxide structures due to the relatively rapid rate at which boron diffuses through silicon dioxide.

In very thin oxide structures, (i.e., $t_{ox} \leq 3$ nm), boron ions from the heavily doped p+ polysilicon can diffuse through the oxide into the silicon bulk, thereby shifting the threshold voltage $V_T$ of the p-channel devices. This limitation on the thickness of the p-channel oxide has typically limited the oxide thickness of the n-channel devices as well because it is highly desirable from a manufacturing perspective to grow the capacitor or gate oxide nonselectively, (i.e., grow the gate across the entire wafer rather than in selected or masked regions of the wafer). The nonselective oxide growth tends to result in oxide thicknesses that are uniform across the entire wafer. Furthermore, conventional processing considerations teach away from multiple gate oxide thicknesses within a technology because of the nonsymetry that would result from the use of such multiple thickness oxide technologies.

The desire to maintain symmetry has undesirably limited the potential performance of the n-channel devices in certain CMOS processes by restricting the minimum thickness of the gate oxide. More generally, symmetry considerations have prohibited designs in which selected critical transistors could be designated as high performance, thin oxide transistors. It would, therefore, be desirable to achieve a semiconductor manufacturing process in which selected transistors incorporate a gate oxide having a first thickness while the remaining transistors have a second gate oxide thickness without unduly complicating the process flow.

SUMMARY OF THE INVENTION

The problems identified above are in large part addressed by a manufacturing process capable of producing at least two different oxide thicknesses. Nitrogen is incorporated into selected areas of the silicon prior to the formation of the gate oxide. A subsequent gate oxide cycle results in a first oxide thickness over the nitrogen regions of the silicon and a second gate oxide thickness over the remaining regions of the silicon. The first oxide thickness will tend to be less than the second oxide thickness due to the tendency of the nitrogen to retard the silicon oxidation rate. In this manner, multiple gate oxide thicknesses can be achieved without unduly complicating the manufacturing process.

Broadly speaking, the present invention contemplates a semiconductor process. A semiconductive substrate having a first region and a second region is provided. The first region and the second region are laterally displaced with respect to one another. A nitrogen species impurity distribution is then introduced into the first region of the semiconductor substrate. Thereafter, a gate dielectric layer is grown on an upper surface of the semiconductor substrate. The gate dielectric has a first thickness over the first region of the semiconductor substrate and a second thickness over the second region of the semiconductor substrate. The first thickness is less than the second thickness. In a CMOS embodiment of the present invention, the first region of the semiconductor substrate comprises p-type silicon while the second substrate region comprises n-type silicon. Preferably, the step of introducing the nitrogen species impurity distribution into the semiconductor substrate is accomplished by thermally oxidizing the first substrate region in a nitrogen bearing ambient. In a presently preferred embodiment, the nitrogen bearing ambient includes $N_2O$, $NH_3$, $O_2$ and HCl in an approximate ratio of 60:30:7:3. In alternative embodiments the nitrogen bearing ambient includes NO, $O_2$ and HCl in an approximate ratio of 90:7:3 or $N_2O$, $O_2$ and HCl in an approximate ratio of 90:7:3. The introduction of the nitrogen species impurity into first substrate region 102 may alternatively be accomplished with rapid thermal anneal processing.

In one embodiment, an initial oxide layer is formed on an upper surface of the semiconductor substrate prior to thermally oxidizing the first substrate region. The formation of the initial oxide layer, in one embodiment, is followed by forming a silicon nitride layer on the initial oxide layer and removing portions of the silicon nitride layer over the first region of the semiconductor substrate. In alternative embodiments, the initial oxide layer can comprise a thermal oxide or an oxide deposited in a CVD reactor.

The present invention further contemplates an integrated circuit. The integrated circuit includes a semiconductor substrate having a first substrate region and a second substrate region. The first substrate region is laterally displaced with respect to the second substrate region. The first substrate region includes a nitrogen species impurity distribution. The integrated circuit further includes a first gate dielectric formed on an upper service of the first region of the semiconductor substrate. The first gate dielectric has a first thickness. A second gate dielectric is formed on an upper surface of the second region of the semiconductor substrate. The second gate dielectric has a second thickness which is greater than the first thickness. In a CMOS embodiment, the first region of the semiconductor substrate comprises p-type silicon and the second region of the semiconductor substrate comprises n-type silicon.

In a preferred embodiment, the integrated circuit further includes a dielectric isolation structure formed within an upper region of the semiconductor substrate. The dielectric isolation structure is laterally disposed between the first region and the second region. Preferably, the integrated circuit further comprises a first conductive gate formed on the gate dielectric over the first region of the semiconductor substrate, a second conductive gate formed on the gate dielectric over the second region of a semiconductor substrate, a first pair of source/drain regions laterally disposed on either side of the first conductive gate within the first region of the semiconductor substrate, and a second pair of source/drain regions laterally disposed on either side of the second conductive gate within the second region of the semiconductor substrate.

In a presently preferred CMOS embodiment, the first conductive gate comprises n+ polysilicon and the second conductive gate comprises p+ polysilicon. In a presently preferred CMOS embodiment, the first region of the semiconductor substrate comprises p-type silicon, the second region of the semiconductor substrate comprises n-type silicon, the first pair of source/drain regions comprises n-type silicon, and the second pair of source/drain regions comprises p-type silicon. The first gate dielectric and the second gate dielectric preferably comprise a thermal oxide and, in a presently preferred embodiment, the first thickness is less than the second thickness. In one embodiment, the first thickness is approximately 15 angstroms, and the second thickness is approximately 30 angstroms.

BRIEF DESCRIPTION OF THE DRAWINGS

Other objects and advantages of the invention will become apparent upon reading the following detailed description and upon reference to the accompanying drawings in which.

Figure 1:
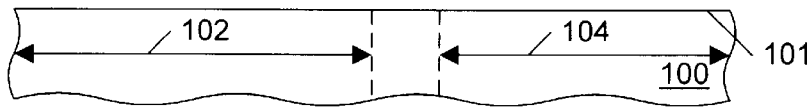
FIG. 1 is a partial cross-sectional view of a semiconductor substrate.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF DRAWINGS

Figure 2:
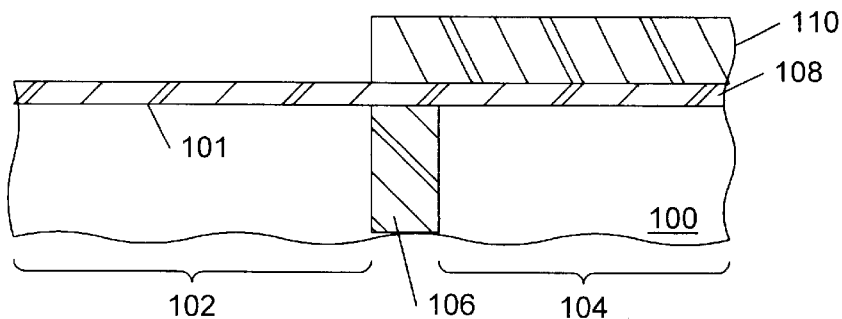
FIG. 2 is a processing step subsequent to FIG. 1 in which an isolation dielectric structure has been formed between a first semiconductor substrate region and a second semiconductor substrate region and an initial oxide layer and a silicon nitride layer have been patterned on the semiconductor substrate.

Turning now to the drawings, FIGS. 1–8 disclose a presently preferred processing sequence for forming the dual oxide integrated circuit of the present invention. Turning to FIG. 1, a semiconductor substrate 100 is provided. A semiconductor substrate 100 includes a first substrate region 102 and a second substrate region 104. First substrate region 102 is laterally displaced with respect to second substrate region 104. Semiconductor substrate 100 preferably comprises single crystal silicon. In a CMOS embodiment, first substrate region 102 comprises p-type silicon and second substrate region 104 comprises n-type silicon. Turning now to FIG. 2, isolation dielectric structure 106 is formed between first substrate region 102 and second substrate region 104 to electrically isolate the two regions from one another thereby preventing the inadvertent coupling of first substrate region 102 to second substrate region 104. In the presently preferred embodiment depicted in FIG. 2, isolation dielectric structure 106 comprises a shallow trench isolation dielectric. Shallow trench isolation provides adequate electrical isolation between adjoining substrate regions while maintaining the planarity of upper surface 101 of silicon substrate 100. The shallow trench dielectric structure 106 shown in the Fig. is typically fabricated by etching a trench into silicon substrate 100 through the use of a dry anisotropic silicon etch process. Thereafter, a dielectric material such as CVD oxide is deposited across silicon substrate 100 to fill the trench with dielectric material. The oxide deposition step may be preceded by a thermal oxidation step in which a thin thermal oxide is grown at the side walls and floor of the trench. After the oxide deposition step, a planarization step is performed to remove oxide material from regions exterior to the trench. Although the presently preferred embodiment is implemented with a shallow trench isolation dielectric structure, it will be appreciated by those skilled in the art that alternative isolation methods may be substituted. As an example, a LOCOS isolation structure can be substituted for shallow trench dielectric structure 106. The LOCOS structure is formed according to a well-known process sequence in which active regions of the silicon substrate are masked by a silicon nitride layer typically desposed on top of a sacrificial oxide layer. The silicon nitride layer is patterned to expose regions of the semiconductor substrate into which it is desired to place an isolation structure. A subsequent thermal oxidation step will result in the formation of a thermal oxide partially grown within silicon substrate 100 and partially extending above upper surface 101 of silicon substrate 100 in regions where the silicon nitride layer has been patterned away. After the thermal oxidation step, the silicon nitride layer is removed leaving behind the LOCOS isolation structure. The LOCOS isolation structure has the dual disadvantages of resulting in a nonplanar surface and having a bird's peak structure that encroaches on the active region of the neighboring transistors.

After the formation of isolation dielectric structure 106, an initial oxide layer 108 is formed on upper surface 101 of silicon substrate 100. In the presently preferred embodiment, initial oxide 108 may be formed with a thermal oxidation process or with a CVD deposition step. Thereafter, silicon nitride layer 110 is deposited upon initial oxide 108 and patterned with a masking step to remove portions of silicon nitride layer 110 above first region 102 of semiconductor substrate 100. Initial oxide 108 serves to reduce the amount of stress upon silicon substrate 100 caused by silicon nitride layer 110. The portion of initial oxide 108 over first substrate region 102 may, in alternative embodiments, be removed prior to the thermal oxidation step described below with respect to FIG. 3 or may be left in place such that the thermal oxidation step of FIG. 3 comprises a reoxidation of initial oxide 108 over first substrate region 102. In the former embodiment, initial oxide 108 over first substrate region 102 is removed, preferably in conjunction with the etch of the silicon nitride layer such that an upper surface 101 of silicon substrate 102 is exposed. In an embodiment in which initial oxide 108 is left in place over first substrate region 102, initial oxide 108 comprises a nitrogen-free or "pure" oxide. This pure oxide layer can be used to adjust the final thicknesses of the dielectric over first substrate region 102 and, accordingly, the concentration of nitrogen within substrate 100 as described below.

Figure 3:
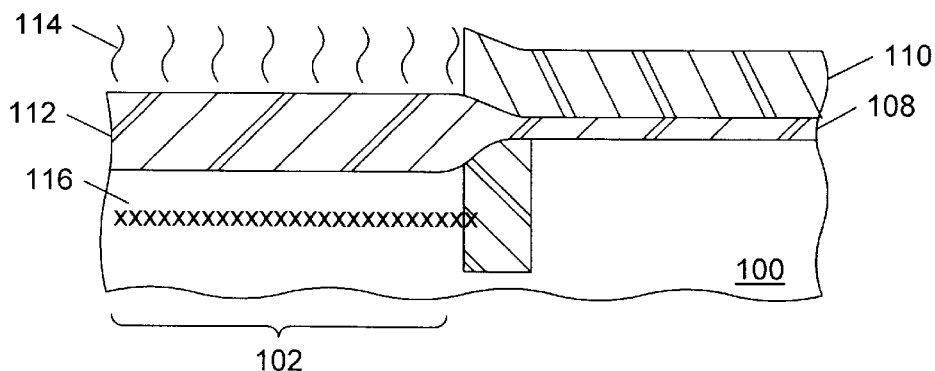
FIG. 3 is a processing step subsequent to FIG. 2 in which a thermal oxide is grown in the presence of a nitrogen bearing ambient.

Turning to FIG. 3, a thermal oxidation process is performed in nitrogen bearing ambient 114 such that nitrogen bearing oxide 112 is formed over first substrate region 102 and nitrogen species distribution 116 is formed within first substrate region 102 of semiconductor substrate 100. Nitrogen bearing ambient 114 preferably includes $O_2$, HCl, and a source of nitrogen, such as NO, $N_2O$, or $NH_3$. In a presently preferred embodiment, nitrogen bearing ambient 114 comprises $N_2O$, $NH_3$, $O_2$, and HCl in an approximate ratio of 60:30:7:3. In alternative embodiments, nitrogen bearing ambient 114 may comprise $N_2O$, $O_2$, and HCl or NO, $O_2$, and HCl in approximate ratios of 90:7:3. In one embodiment, ambient 114 may comprise a nitrogen-free ambient for an initial period of the oxidation process. After the initial period, nitrogen may be introduced into ambient 114 to produce the nitrogen bearing ambient previously described. In such an embodiment, the oxidation that occurs during the time period when ambient 114 is free of a nitrogen species produces a nitrogen-free initial oxide. The subsequent oxidation that occurs when nitrogen is introduced into ambient 114 produces a nitrogen bearing oxide 112 and the nitrogen bearing impurity distribution 116 within first substrate region 102. Alternatively, after the formation of a nitrogen-free initial oxide, nitrogen may be introduced into first substrate region 102 in a 100% NO or $N_2O$ ambient.

Rapid thermal annealing may be substituted in part or in whole for the processing described above with respect to initial oxide 108, nitrogen bearing oxide 112, and nitrogen impurity distribution 116. More specifically, one embodiment of the present invention contemplates forming initial oxide 108 with a rapid thermal anneal step and thereafter introducing nitrogen into semiconductor substrate 101 with in a diffusion tube as described above. Alternatively, the entire sequence may be performed in a rapid thermal anneal process. As an example, such a process would form initial oxide 108 with an RTA process in a nitrogen free ambient and thereafter form nitrogen bearing oxide 112 with an RTA process in a nitrogen bearing ambient such as any of the nitrogen bearing ambients described above. The rapid thermal annealing contemplated herein would preferably include subjecting the semiconductor wafer to a temperature of 900°–1100° C. for a period of 10 to 30 seconds.

As previously mentioned, nitrogen bearing oxide 112 may be grown from no initial oxide, in which case initial oxide 108 is removed over first substrate region 102 prior to the thermal oxidation of FIG. 3. Alternatively, initial oxide 108 over first substrate region 102 may be left in place, such that the oxidation step of FIG. 3 comprises a reoxidation. The option to perform the thermal oxidation of FIG. 3 with or without an initial oxide 108 allows for greater control over the final thickness of nitrogen bearing oxide 112. The presence of a nitrogen source within nitrogen bearing ambient 114 results in the formation of a nitrogen bearing impurity distribution 116 within first substrate region 102 of semiconductor substrate 100. Unlike impurity distributions comprising arsenic, phosphorous, or boron, nitrogen distribution 116 does not significantly alter the electrical properties of first substrate region 102. It is theorized, however, that the nitrogen molecules within distribution 116 form strong bonds with silicon atoms in semiconductor substrate 100. The strong bonds between the nitrogen and silicon retard the process whereby silicon bonds with oxygen to form a silicon-oxide film such as silicon dioxide. Thus, the oxidation rate of a nitrogen bearing silicon substrate is less than the oxidation rate of a pure silicon substrate. This oxidation rate differential can be advantageously used to produce an oxide film having a variable thickness.

Figure 4:
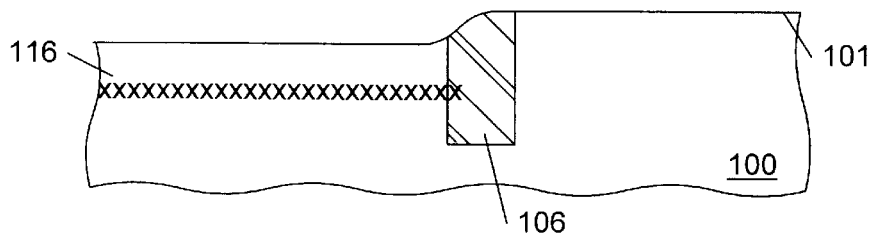
FIG. 4 is a processing step subsequent to FIG. 3 in which the thermal oxide, the initial oxide, and the silicon nitride layer have been removed.

Turning to FIG. 4, nitrogen bearing oxide 112, initial oxide 108, and silicon nitride layer 110 are removed from upper surface 101 of semiconductor substrate 100. Removal of silicon nitride preferably occurs through the use of an 85% phosphoric solution at 120° C. Removal of oxides 112 and 108 can be accomplished with a wet or dry etch process.

Figure 5:
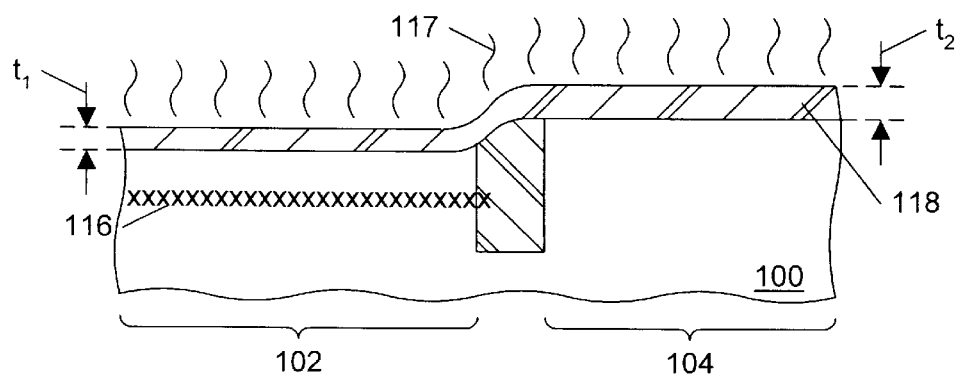
FIG. 5 is a processing step subsequent to FIG. 4 in which a gate dielectric layer has been grown on an upper surface of the semiconductor substrate.

Turning to FIG. 5, gate dielectric 118 is grown upon upper surface 101 of semiconductor substrate 100 using thermal oxidation 117. Thermal oxidation 117 results in a gate dielectric 118 having a first thickness $t_1$ over first substrate region 102 and a second thickness $t_2$ over second substrate region 104. Preferably, nitrogen bearing impurity distribution 116 within first substrate region 102 retards the oxidation of first substrate region 102 relative to the oxidation rate of second substrate region 104 such that second thickness $t_2$ is greater than first thickness $t_1$. In a presently preferred embodiment, $t_2$ is approximately 15 angstroms and $t_2$ is approximately 30 angstroms. Thus, the present invention advantageously enables the growth of an oxide film having dual thicknesses, wherein the regions of the semiconductor substrate over which the thinner oxide is formed is determined by a conventional masking step coupled with an oxidation step in the presence of a nitrogen ambient. Because nitrogen passively interacts with the silicon substrate, the present invention produces dual oxide thicknesses without significantly altering the electrical properties of semiconductor substrate 100 thereby eliminating the need to significantly alter subsequent processing. In one embodiment, first substrate region 102 of semiconductor substrate 100 may comprise the n-channel region of a CMOS process while second substrate region 104 comprises the p-channel region. In another embodiment, first substrate region 102 and second substrate region 104 could both be comprised of p-type silicon such that the process would result in the formation of selected n-channel transistors having thinner gate oxides and, accordingly, higher values of saturated drain current, $I_{Dsat}$.

Figure 6:
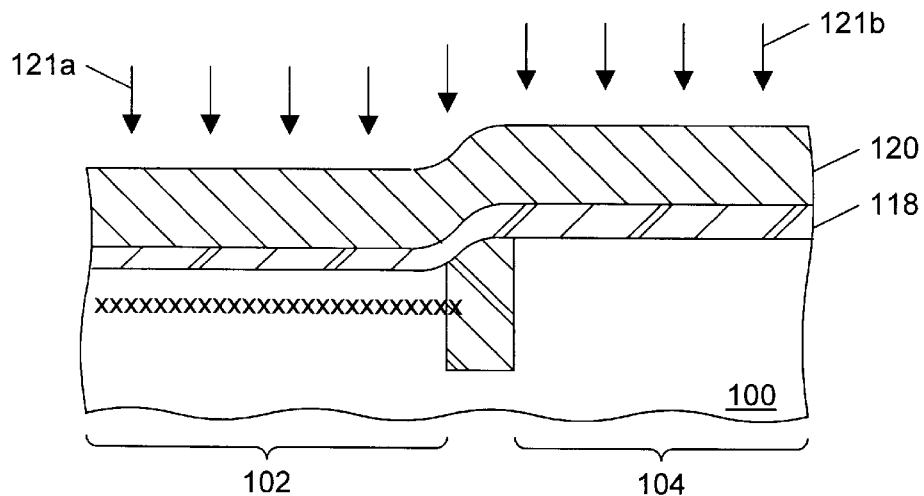
FIG. 6 is a processing step subsequent to FIG. 5 in which a polysilicon layer has been deposited on the gate dielectric layer.

FIG. 6 depicts the deposition of a conductive gate layer 120 upon gate dielectric layer 118. Preferably, conductive gate layer 120 comprises CVD polysilicon. Typically, the resistivity of as-deposited silicon must be reduced by doping the polysilicon layer with impurities. The doping of polysilicon may be accomplished in situ or through the use of a subsequent diffusion process. More preferably, however, ion implantation is used to dope polysilicon. FIG. 6 depicts ion implementation 121 doping polysilicon layer 120. In a presently preferred CMOS embodiment of the present invention, ion implantation 121 comprises a first implantation 121a over first substrate region 102 and a second implantation 121b over second substrate region 104. In this embodiment, first substrate region 102 comprises the n-channel region of the CMOS integrated circuit. The work functions of n+ polysilicon and p+ polysilicon are such that it is often desirable to use n+ polysilicon gates for the n-channel devices and p+ polysilicon gates for the p-channel devices despite the increase in process complexity that results from the result of the requirement of two selective implants. In this embodiment, implant 121a represents the implantation of n-type impurities such as arsenic or phosphorus into conductive gate layer 120 over first substrate regions 102 of semiconductor substrate 100. Implant 121b represents the implantation of a p-type impurity such as boron into conductive gate layer 120 over second substrate region 104 of semiconductor substrate 100.

Despite the desirability of implementing p+ polysilicon as the gate for a p-channel device, the incorporation of boron ions into the polysilicon gate of a p-channel device is problematic in that boron is known to diffuse rapidly through silicon dioxide. Processing subsequent to the implantation of boron ions into conductive gate layer 120 can result in the diffusion of boron ions from conductive gate layer 120 through gate dielectric 118 and into an upper region of semiconductor substrate 100. This unintended boron distribution within semiconductor substrate 100 proximal to the silicon dioxide silicon interface may unintentionally and undesirably alter the threshold voltage of the p-channel devices. As gate oxide thicknesses invade the sub five nanometer region, the boron diffusion problem becomes greater. On the other hand, it is highly desirable to achieve thin gate oxides to improve circuit performance. The n-type dopants phosphorous and arsenic do not experience any significant diffusion through silicon dioxide. Therefore, n-channel devices can theoretically be fabricated with extremely thin gate oxides. The present invention accommodates high performance n-channel devices with extremely thin gate oxides as well as p+ polysilicon gate p-channel devices requiring thicker gate oxides to prevent unwanted threshold voltage shifting. By incorporating nitrogen into selected regions of the silicon substrate, the oxidation rate can be selectively controlled over desired regions of the substrate such that thin gate oxides are produced in desired locations. In a presently preferred embodiment, the first thickness $t_1$ of gate dielectric 118 over first substration region 102 is approximately 15 angstroms while the second thickness $t_2$ of gate dielectric 118 over second substrate region 104 of silicon substrate 100 is approximately 30 to 50 angstroms. The ratio of first thickness $t_1$ to second thickness $t_2$ can be controlled by altering the concentration of nitrogen distribution 116 within first substrate region 102. Control of the concentration of nitrogen distribution 116 is accomplished by altering the thickness of initial oxide layer 108 formed prior to the thermal oxidation in nitrogen ambient 114. The highest concentration of nitrogen distribution 116 is achieved by initiating thermal oxidation process shown in FIG. 3 with no initial oxide present on upper surface 101 of silicon substrate 100. Higher nitrogen impurity concentrations result in a greater ratio of thickness $t_2$ to $t_1$.

Figure 7:
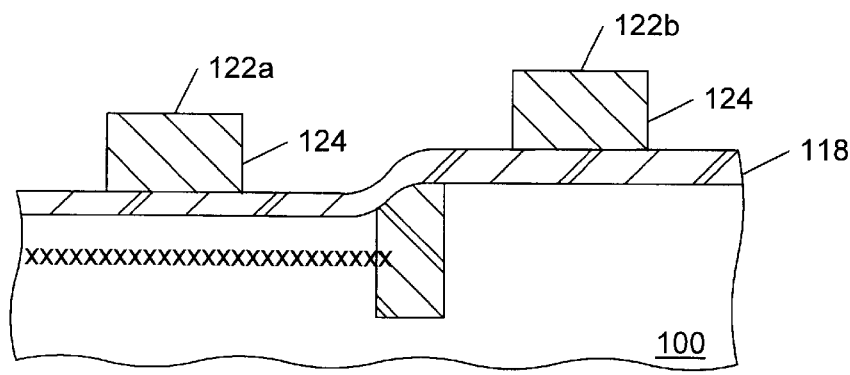
FIG. 7 is a processing step subsequent to FIG. 6 in which a pair of polysilicon gate structures has been patterned from the polysilicon layer.

FIG. 7 shows a processing step subsequent to FIG. 6 in which a pair of polysilicon gates 122a and 122b have been patterned from conductive gate layer 120. The patterning of polysilicon gates 122a and 122b is accomplished with conventional photolithography and etch steps as are well-known in the field of semiconductor processing. The isotropic etch used to form polysilicon gates 122a and 122b results in substantially vertical side walls 124.

Figure 8:
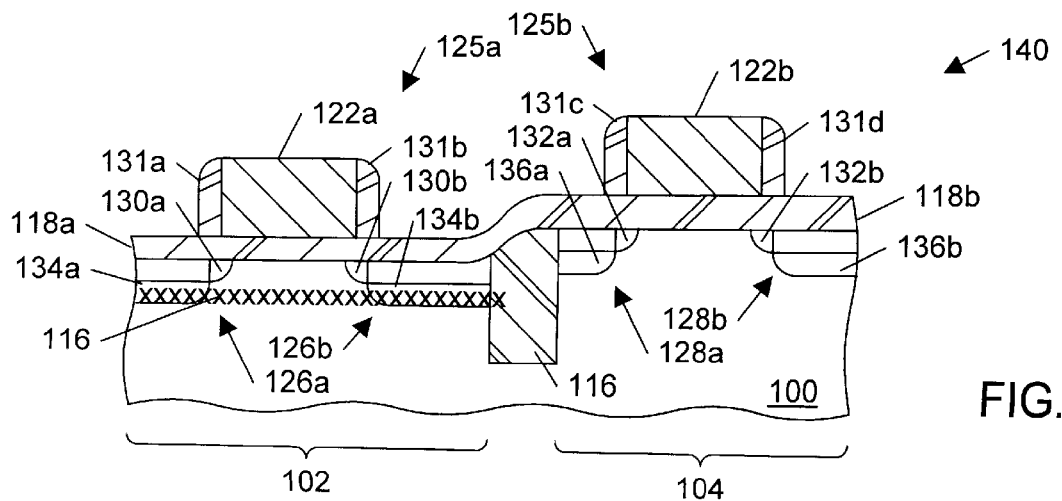
FIG. 8 is a processing step subsequent to FIG. 7 in which source/drain regions have been formed laterally disposed on either side of the polysilicon gates.

FIG. 8 shows subsequent processing steps resulting in the formation of a pair of transistors 125a and 125b. Transistor 125a includes a pair of source/drain regions 126a and 126b while transistor 125b includes a pair of source/drain regions 128a and 128b. In a presently preferred CMOS embodiment, source/drain regions 126a and 126b comprise n-type silicon whereas source/drain regions 128a and 128b comprise p-type silicon. Source/drain regions 126 further comprise LDD region 130 and heavily doped region 134. LDD 130 region is formed by implanting an impurity into semiconductor substrate 100 prior to the formation of spacer structures 131 upon substantially vertical sidewalls 134 of polysilicon gates 122. The formation of spacer structures 131 is well-known in the field of semiconductor processing and generally comprises depositing a conformal oxide layer, typically a CVD TEOS oxide, and thereafter anisotropically etching the conformal oxide layer with minimal overetch such that spacer structures 131 are left behind after all of the oxide has been cleared from the planar regions of the wafer topography. Subsequent to the formation of spacer structures 131, a source/drain implant is performed to form heavily doped regions 134. As will be appreciated to those skilled in the art, LDD regions 132 and heavily doped regions 136 of transistor 125b are formed with the process steps analogous to those used to form LDD region 130 and heavily doped region 134 of transistor 125a. Thus, FIG. 8 reveals an integrated circuit 140. Integrated circuit 140 includes semiconductor substrate 100 comprised of first substrate region 102 laterally displaced from second substrate region 104. First substrate region 102 includes a nitrogen species impurity distribution 116. Integrated circuit 140 further includes first gate dielectric 118a formed on an upper surface 101 of first substrate region 102. First gate dielectric 118a has a first thickness $t_1$. Integrated circuit 140 further includes a second gate dielectric 118b formed on upper surface 101 of second substrate region 104. Second dielectric 118b has a second thickness $t_2$. Second thickness $t_2$ is greater than first thickness $t_1$. In an presently preferred CMOS embodiment of the present invention, first substrate region 102 comprises p-type silicon and second substrate region 104 comprises n-type silicon. Preferably, isolation dielectric 116 is formed within semiconductor substrate 100 laterally disposed between first substrate region 102 and second substrate region 104. Integrated circuit 140, in a preferred embodiment, further includes a first conductive gate 122a, formed over first substrate region 102 and a second conductive gate 122b formed over second substrate region 104. In a presently preferred CMOS embodiment, first conductive gate 122a comprises n+ polysilicon while second conductive gate 122b comprises p+ polysilicon.

It will, therefore, be appreciated to those skilled in the art having the benefit of this disclosure that this invention is capable of producing an integrated circuit including dual oxide thicknesses for selective formation of high performance transistors within the integrated circuit. Furthermore, it is to be understood that the form of the invention shown and described is to be taken as presently preferred embodiments. Various modifications and changes may be made to each and every processing step as would be obvious to a person skilled in the art having the benefit of this disclosure. It is intended that the following claims be interpreted to embrace all such modifications and changes and, accordingly, the specification and drawings are to be regarded in an illustrative rather than a restrictive sense.

What is claimed is:

1. A semiconductor process, comprising:

providing a semiconductor substrate, wherein said semiconductor substrate comprises a first region and a second region, wherein said second region is laterally disposed with respect to said first region, and wherein said first region comprises p-type silicon and said second region comprises n-type silicon;

forming an initial oxide layer on an upper surface of said semiconductor substrate;

forming a silicon nitride layer on said initial oxide layer;

removing portions of said silicon nitride over said first region of said semiconductor substrate;

introducing a nitrogen species impurity distribution into said first region of said semiconductor substrate; and growing a gate dielectric layer simultaneously on an upper surface of said first and second regions of said semiconductor substrate wherein said gate dielectric has a first thickness over said first region of said semiconductor substrate and a second thickness over said second region of said semiconductor substrate, and further wherein said first thickness is less than said second thickness.

2. The process of claim 1 wherein the step of introducing said nitrogen species impurity distribution comprises thermally oxidizing said first substrate region in a nitrogen bearing ambient.

3. The process of claim 1 wherein the step of introducing said nitrogen species impurity distribution comprises rapid thermal annealing said first substrate region in a nitrogen bearing ambient.

4. The process of claim 3 wherein said nitrogen bearing ambient comprises $N_2O$, $NH_3$, $O_2$, and HCl in an approximate ratio of 60:30:7:3.

5. The process of claim 3 wherein said nitrogen bearing ambient comprises $N_2O$, $O_2$, and HCl in an approximate ratio of 90:7:3.

6. The process of claim 3 wherein said nitrogen bearing ambient comprises NO, $O_2$, and HCl in an approximate ratio of 90:7:3.

7. The process of claim 1 wherein the step of forming said initial oxide layer comprises thermally oxidizing an upper surface of said semiconductor substrate in a nitrogen free ambient.

8. The process of claim 1 wherein the step of forming said initial oxide layer comprises depositing oxide on an upper surface of said semiconductor substrate.

9. A semiconductor process, comprising:

providing a semiconductor substrate, wherein said semiconductor substrate comprises a first region and a second region, wherein said second region is laterally disposed with respect to said first region;

introducing a nitrogen species impurity distribution into said first region of said semiconductor substrate, wherein said introducing a nitrogen species impurity distribution comprises thermally oxidizing said first substrate region in a nitrogen bearing ambient; and growing a gate dielectric layer simultaneously on an upper surface of said first and second regions of said semiconductor substrate wherein said gate dielectric has a first thickness over said first region of said semiconductor substrate and a second thickness over said second region of said semiconductor substrate, and further wherein said first thickness is less than said second thickness.

10. The process of claim 9 further comprising, prior to said thermally oxidizing, forming an initial oxide layer on an upper surface of said semiconductor surface.

11. The process of claim 10 further comprising:

forming a silicon nitride layer on said initial oxide layer; and removing portions of said silicon nitride layer over said first region of said semiconductor substrate.

12. A semiconductor process, comprising:

providing a semiconductor substrate, wherein said semiconductor substrate comprises a first region and a second region, wherein said second region is laterally disposed with respect to said first region;

introducing a nitrogen species impurity distribution into said first region of said semiconductor substrate, wherein said introducing said nitrogen species impurity distribution comprises rapid thermal annealing said first substrate region in a nitrogen bearing ambient; and growing a gate dielectric layer simultaneously on an upper surface of said first and second regions of said semiconductor substrate wherein said gate dielectric has a first thickness over said first region of said semiconductor substrate and a second thickness over said second region of said semiconductor substrate, and further wherein said first thickness is less than said second thickness.

13. The process of claim 12 wherein said nitrogen bearing ambient comprises $N_2O$, $NH_3$, $O_2$, and HCl in an approximate ratio of 60:30:7:3.

14. The process of claim 12 wherein said nitrogen bearing ambient comprises $N_2O$, $O_2$, and HCl in an approximate ratio of 90:7:3.

15. The process of claim 12 wherein said nitrogen bearing ambient comprises NO, $O_2$, and HCl in an approximate ratio of 90:7:3.

16. The process of claim 12 further comprising, prior to said thermally oxidizing, forming an initial oxide layer on an upper surface of said semiconductor surface.

17. The process of claim 16 further comprising:

forming a silicon nitride layer on said initial oxide layer; and removing portions of said silicon nitride layer over said first region of said semiconductor substrate.

18. The process of claim 16 wherein said forming an initial oxide layer comprises thermally oxidizing an upper surface of said semiconductor substrate in a nitrogen free ambient.

19. The process of claim 16 wherein said forming an initial oxide layer comprises depositing oxide on an upper surface of said semiconductor substrate.

* * * * *